United States Patent
Ngo et al.

[11] Patent Number: 6,096,661
[45] Date of Patent: Aug. 1, 2000

[54] METHOD FOR DEPOSITING SILICON DIOXIDE USING LOW TEMPERATURES

[75] Inventors: Minh Van Ngo, Union City; Terri Jo Kitson, San Jose; Khanh Nguyen, San Mateo, all of Calif.

[73] Assignee: Advanced Micro Devices, Inc., Sunnyvale, Calif.

[21] Appl. No.: 09/212,198

[22] Filed: Dec. 15, 1998

[51] Int. Cl.$^7$ .................................................. H01L 21/31
[52] U.S. Cl. ........................................................ 438/788
[58] Field of Search ............................................. 438/788

[56] References Cited

U.S. PATENT DOCUMENTS

| | | | |
|---|---|---|---|
| 5,736,423 | 4/1998 | Ngo | 437/238 |
| 5,895,259 | 4/1999 | Carter et al. | 438/563 |

OTHER PUBLICATIONS

S. M. Akhter, B. Y. Majlis, S. Shaari. The Study of the Effects of Substrate Temperature on the PECVD SiO2 Layer Using IPL 200E/D System. ICSE '96 Proc., Nov. 1996, Penang, Malaysia. pp. 293–296.

*Primary Examiner*—Olik Chaudhuri
*Assistant Examiner*—Ginette Peralta
*Attorney, Agent, or Firm*—Monica H. Choi

[57] ABSTRACT

A method for depositing silicon dioxide on a semiconductor wafer uses plasma enhanced chemical vapor deposition at very low temperatures. The temperature in a silicon dioxide deposition chamber is set to be about 170° C. or less. Silane gas ($SiH_4$) flows into the silicon dioxide deposition chamber with a flow rate in a range of from about 50 sccm (standard cubic cm per minute) to about 110 sccm. Nitrogen gas ($N_2$) flows into the silicon dioxide deposition chamber with a flow rate in a range of from about 500 sccm to about 3000 sccm. Nitrous oxide gas ($N_2O$) flows into the silicon dioxide deposition chamber with a flow rate in a range of from about 5000 sccm to about 9000 sccm. A high frequency RF signal is applied on a showerhead within the deposition chamber. A low frequency RF signal is applied on a heating block for holding the semiconductor wafer. A predetermined volume for the silicon dioxide deposition chamber is used such that pressure within the silicon dioxide deposition chamber is in a range of from about 0.5 torr to about 1.3 torr. The semiconductor wafer is placed inside the silicon dioxide deposition chamber for a soak time period in a range of from about 30 seconds to about 40 seconds before the high frequency RF signal is applied on the showerhead in the deposition chamber and the low frequency RF signal is applied on the heating block. When the semiconductor wafer reaches the deposition temperature, the high frequency RF signal and the low frequency RF signal are applied for deposition of the silicon dioxide layer onto the semiconductor wafer. By using low temperatures during the deposition of the silicon dioxide layer, the structural integrity of any structure already on the semiconductor wafer is advantageously preserved.

6 Claims, 3 Drawing Sheets

METHOD FOR DEPOSITING SILICON DIOXIDE USING LOW TEMPERATURES

TECHNICAL FIELD

The present invention relates generally to lithography, and more particularly, to a method for effectively depositing silicon dioxide at very low temperatures on an EUV mask to preserve the integrity of the EUV mask.

BACKGROUND OF THE INVENTION

As device densities continually increase on a semiconductor wafer, device dimensions are further scaled down to smaller feature size. With such smaller feature size, higher resolution photolithographic processes are desired. In general, lithography refers to processes for pattern transfer between various media. As known to one of ordinary skill in the art of integrated circuit fabrication, exposure of a photoresist layer on a semiconductor wafer to a pattern of illumination (such as from ultraviolet light, x-rays, or an electron beam) results in a desired pattern on the semiconductor wafer for further processing.

For smaller feature size, projection lithography and use of extreme ultraviolet (EUV) radiation are important tools for integrated circuit fabrication. Extreme ultraviolet (EUV) radiation has a wavelength range of about 50 to 700 Å (Angstroms) (i.e, about 5 to 70 mn (nanometer)). A projection lithography system 100 using EUV radiation is illustrated in FIG. 1. In the projection lithography system 100, an EUV light source 102 provides EUV radiation as known to one of ordinary skill in the art.

An EUV mask 104 has a pattern of regions which absorb the EUV radiation from the EUV light source 102 and regions which reflect the EUV radiation from the EUV light source 102 to produce a reflected image. A reflective imaging system 106 (which is typically comprised of a series of high precision mirrors) projects the reflected image by de-magnifying or reducing the reflected image from the EUV mask 104 onto a semiconductor wafer 108. The semiconductor wafer 108 has a photoresist layer that is patterned to the de-magnified reflected image from the reflective imaging system 106.

The EUV mask 104 is a reflective reticle having a pattern comprised of regions which absorb the EUV radiation from the EUV light source 102 and regions which reflect the EUV radiation from the EUV light source 102. The regions which absorb the EUV radiation and the regions which reflect the EUV radiation are formed as shown in FIG. 2. Referring to FIG. 2A, a reflective layer 202 is formed on a substrate layer 204 of silicon or glass. The reflective layer 202 is typically a multilayer coating of alternating layers of molybdenum and silicon having respective thickness of approximately 40 Å (angstroms). The reflective layer 202 is designed to reflect the EUV radiation with high efficiency (e.g., about 65% or more).

The reflective layer 202 is then covered with a buffer layer 206 typically of silicon dioxide which is used to protect the reflective layer 202 and to prevent oxidation of the reflective layer 202 during subsequent processing of the EUV mask. An absorber layer 208 is deposited on top of the buffer layer 206, and the absorber layer is comprised of EUV absorptive material such as silver, tungsten, gold, tantalum, titanium, lead, polyimide, polymethyl methacrylate, etc.

Referring to FIG. 2B, the desired pattern for the regions which absorb the EUV radiation is made by a patterned photoresist layer 210 as known to one of ordinary skill in the art. Referring to FIG. 2C, the absorber layer 208 is patterned according to the photoresist layer 210. Referring to FIG. 2D, the photoresist layer 210 is then removed. The buffer layer 206 of silicon dioxide protects the reflective layer 202 during the etching of the absorber layer 208 and the removal of the photoresist layer 210.

Referring to FIG. 2E, the buffer layer 206 of silicon dioxide is selectively removed for exposing the reflective layer 202 in regions without the absorptive material of the absorber layer 208. In this manner, a pattern of regions that absorb the EUV radiation is formed where the absorptive material of the absorber layer 208 remain. The regions where the reflective layer 202 is exposed reflect the EUV radiation. Referring to FIG. 2F, a capping layer 212 of amorphous silicon of approximately 70 Å (Angstroms) may also be deposited on top of the reflective layer 202 to protect the reflective layer 202.

During fabrication of the EUV mask 104 as shown in FIGS. 2A, the buffer layer 206 of silicon dioxide is deposited on top of the reflective layer 202. The reflective layer 202 is a delicate structure of thin layers (having respective thicknesses of approximately 40 Å (Angstroms)) of alternating molybdenum and silicon. To fabricate an effective EUV mask 104, a process is desired for depositing the buffer layer 206 of silicon dioxide on top of the reflective layer 202 which also preserves the integrity of the reflective layer 202.

In the prior art, processes for depositing silicon dioxide typically use high temperatures of around 300° C. However, such high temperatures may degrade the structure of the reflective layer 202 which is comprised of thin alternating layers of molybdenum and silicon. A process for depositing silicon dioxide using lower temperatures of approximately 170° C. or less is desired for depositing the buffer layer 206 such that the structural integrity of the reflective layer 202 is preserved.

SUMMARY OF THE INVENTION

Accordingly, a primary object of the present invention is to deposit a buffer layer of silicon dioxide at lower temperatures of approximately 170° C. or less in order to preserve the structural integrity of the reflective layer on an EUV mask.

In a general aspect of the present invention, a method for depositing silicon dioxide on an EUV mask uses plasma enhanced chemical vapor deposition at very low temperatures. The method of the present invention includes the step of setting a temperature, in a silicon dioxide deposition chamber, to be about 170° C. or less. In addition, the method of the present invention includes the step of flowing silane gas into the silicon dioxide deposition chamber with a flow rate in a range of from about 50 sccm (standard cubic cm per minute) to about 110 sccm (standard cubic cm per minute), flowing nitrogen gas ($N_2$) into the silicon dioxide deposition chamber with a flow rate in a range of from about 500 sccm (standard cubic cm per minute) to about 3000 sccm (standard cubic cm per minute), and flowing nitrous oxide gas ($N_2O$) into the silicon dioxide deposition chamber with a flow rate in a range of from about 5000 sccm (standard cubic cm per minute) to about 9000 sccm (standard cubic cm per minute).

A predetermined volume for the silicon dioxide deposition chamber is used such that pressure within the silicon dioxide deposition chamber is in a range of from about 0.5 torr to about 1.3 torr. The method of the present invention also includes the step of placing the semiconductor wafer inside the silicon dioxide deposition chamber for a soak time period in a range of from about 30 seconds to about 40 seconds. When the semiconductor wafer reaches a deposition temperature, a high frequency RF signal is applied on a showerhead inside the silicon dioxide deposition chamber, and a low frequency RF signal is applied on a heating block for holding the semiconductor wafer within the silicon dioxide deposition chamber. The high frequency RF signal has a power in a range of from about 200 Watts to about 600 Watts. The low frequency RF signal has a power in a range of from about 150 Watts to about 400 Watts. Silicon dioxide is deposited onto the semiconductor wafer when the high frequency RF signal and the low frequency RF signal are thus applied.

The present invention may be used to particular advantage when the present invention further includes the step of preseasoning the silicon dioxide deposition chamber to a temperature of about 170° C. or less for about 300 seconds before placing the semiconductor wafer inside the silicon dioxide deposition chamber.

By depositing the silicon dioxide layer at the lower temperatures of about 170° C. or less, the structural integrity of the reflective layer already deposited on the EUV mask is preserved during the deposition process of the present invention.

These and other features and advantages of the present invention will be better understood by considering the following detailed description of the invention which is presented with the attached drawings.

BRIEF DESCRIPTION OF THE DRAWINGS

FIG. 2, including

The figures referred to herein are drawn for clarity of illustration and are not necessarily drawn to scale. Elements having the same reference number in FIGS. 1, 2, and 3 refer to elements having similar structure and function.

DETAILED DESCRIPTION

Figure 1:
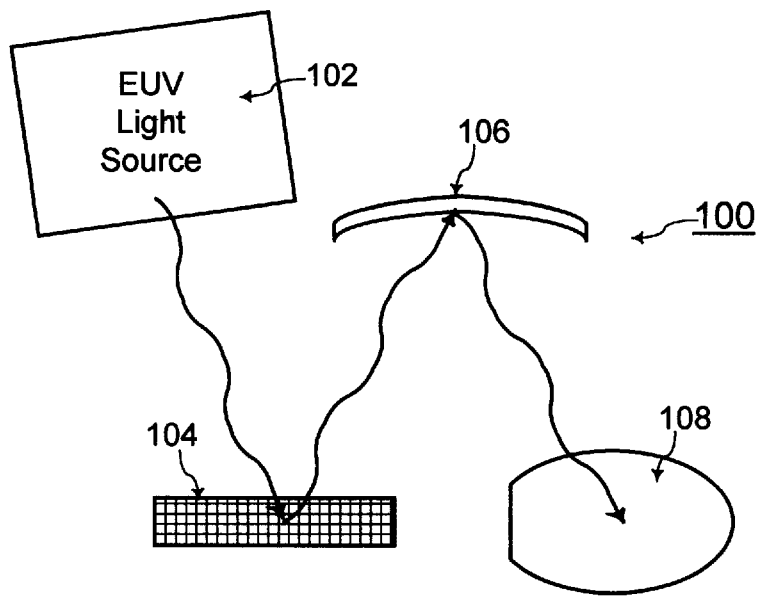
FIG. 1 shows a projection lithography system using a reflective EUV mask.
Figure 2A:
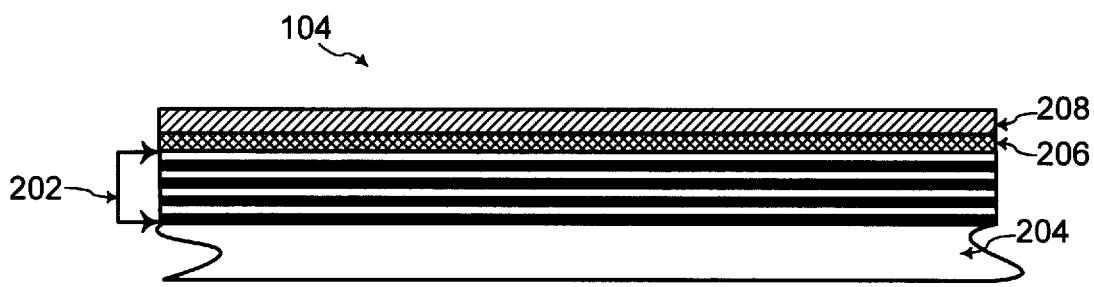
FIGS. 2A, 2B, 2C, 2D, 2E, and 2F, shows the steps for fabricating a reflective EUV mask having a buffer layer of silicon dioxide on top of a reflective layer comprising alternating layers of molybdenum and silicon.
Figure 2B:
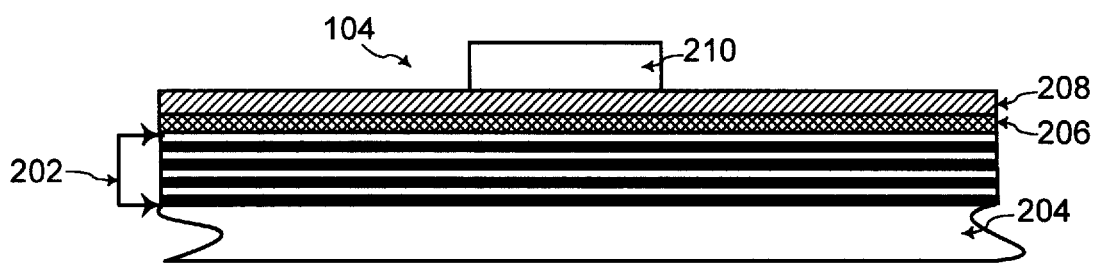
Figure 2C:
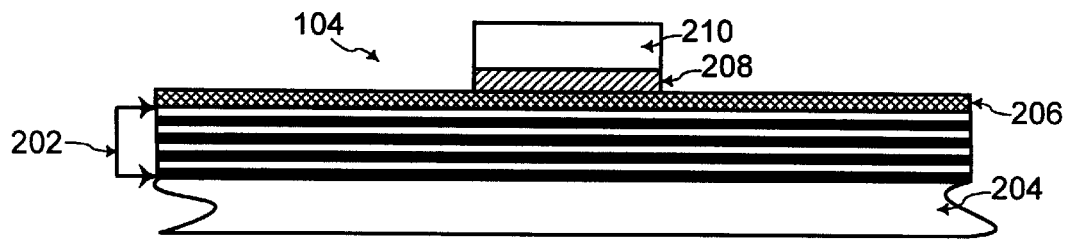
Figure 2D:
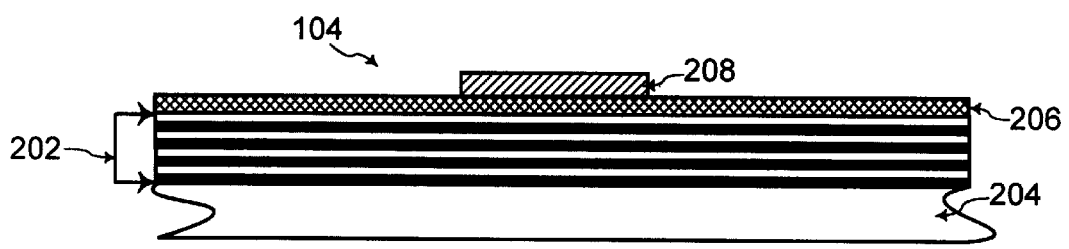
Figure 2E:
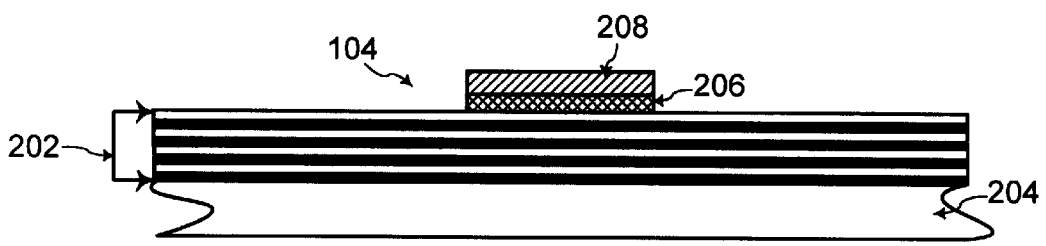
Figure 2F:
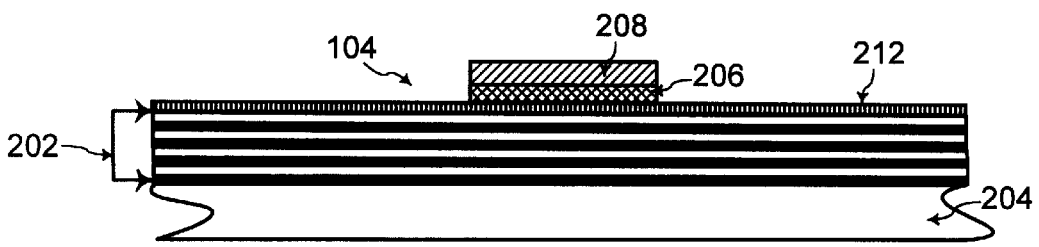
Figure 3:
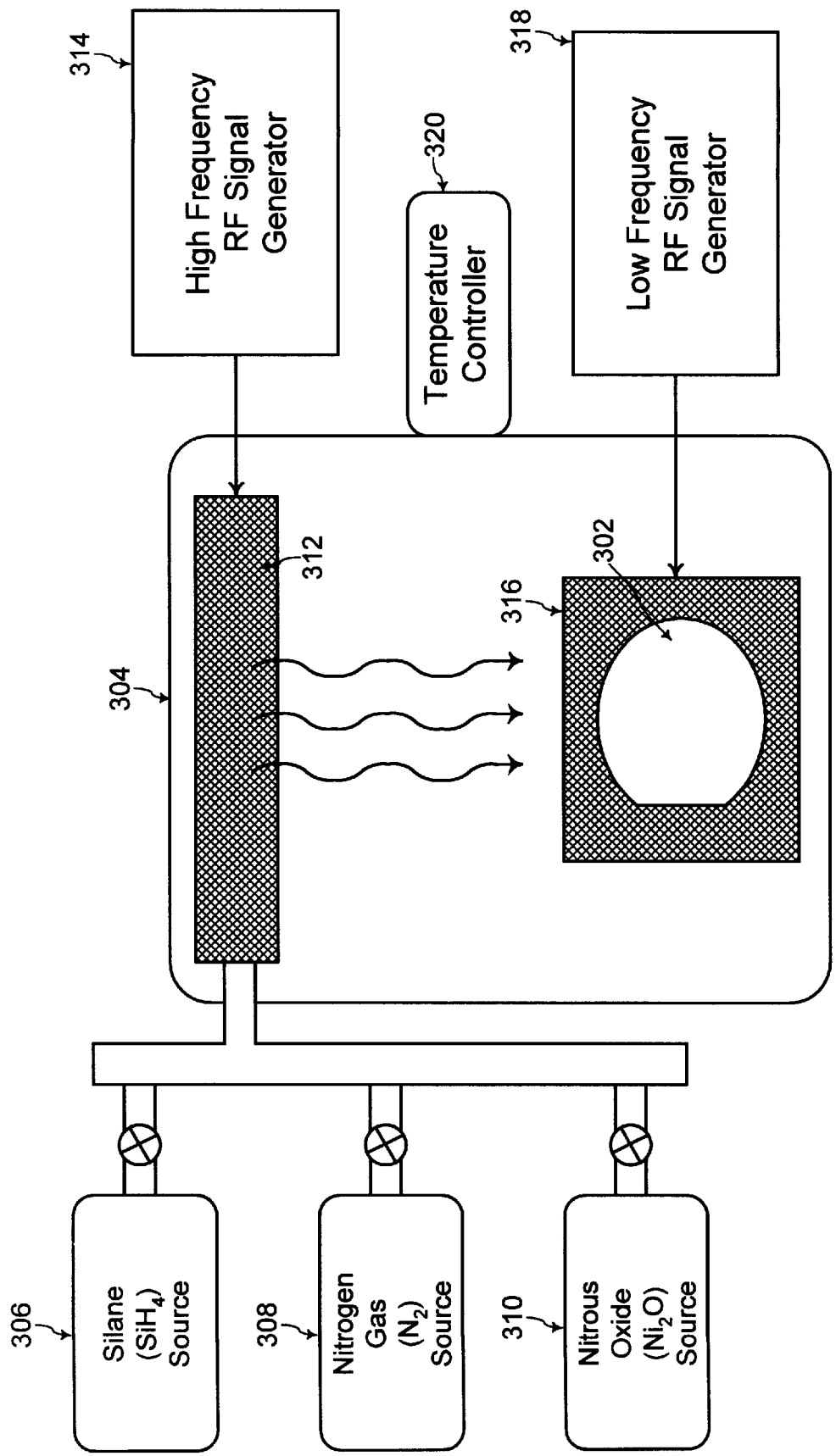
FIG. 3 illustrates a silicon deposition system of the present invention for depositing a silicon dioxide layer at very low temperatures of about 170° C. or less.

The EUV mask may be formed on a substrate layer of silicon or glass. In an exemplary embodiment, the EUV mask is formed on a semiconductor wafer. Referring to FIG. 3, a semiconductor wafer 302 having an EUV mask formed thereon is placed into a silicon dioxide deposition chamber 304 for deposition of silicon dioxide onto the semiconductor wafer 302 which may be comprised of silicon.

A silane ($SiH_4$) source 306, a nitrogen ($N_2$) source 308, and a nitrous oxide ($N_2O$) source 310 are coupled to the silicon dioxide deposition chamber 304. Silane ($SiH_4$) gas flows from the silane ($SiH_4$) source 306 into the silicon dioxide deposition chamber 304. Nitrogen ($N_2$) gas flows from the nitrogen ($N_2$) source 308 into the silicon dioxide deposition chamber 304. Nitrous oxide ($N_2O$) gas flows from the nitrous oxide ($N_2O$) source 310 into the silicon dioxide deposition chamber 304.

The silicon dioxide deposition chamber 304 further includes a showerhead 312 which is fed with silane gas from the silane ($SiH_4$) source 306, nitrogen ($N_2$) gas from the nitrogen ($N_2$) source 308, and nitrous oxide ($N_2O$) gas from the nitrous oxide ($N_2O$) source 310. In addition, a high frequency RF signal generator 314 is operatively coupled to the showerhead 312. A high frequency RF signal from the high frequency RF signal generator 314 is applied to the showerhead 312 for producing the plasma in the plasma enhanced chemical vapor deposition process of the present invention.

The silicon dioxide deposition chamber 304 further includes a heating block 316 which holds the semiconductor wafer 302 during the plasma enhanced chemical vapor deposition of the present invention. The heating block 316 is heated up to a predetermined temperature to maintain the semiconductor wafer 302 at the predetermined temperature. In addition, a low frequency RF signal generator 318 is operatively coupled to the heating block 316. A low frequency RF signal from the low frequency RF signal generator 318 is applied to the heating block 316 holding the semiconductor wafer 302 such that a voltage bias appears on the heating block 302. Such voltage bias on the heating block 302 attracts the plasma generated by the showerhead 312 toward the semiconductor wafer 302. Thus, plasma from the showerhead 312 is present near the semiconductor wafer 302 during the plasma enhanced chemical vapor deposition process of the present invention.

Furthermore, the silicon dioxide deposition chamber 304 of the present invention further includes a deposition chamber temperature controller 320. The temperature controller 320 maintains the temperature within the deposition chamber 304 to be at a predetermined setting.

The operation of the silicon dioxide deposition chamber 304 for depositing silicon dioxide onto the semiconductor wafer 302 using low temperatures is now described. The silicon dioxide deposited onto the semiconductor wafer 302 is advantageously used to form the buffer layer 206 during fabrication of an EUV mask as illustrated in FIG. 2.

In contrast to a prior art silicon dioxide deposition process which uses higher temperatures of about 300° C., the present invention is a low temperature silicon dioxide deposition process that uses lower temperatures of about 170° C. or less. Thus, during fabrication of an EUV mask as illustrated in FIG. 2, the structural integrity of the reflective layer 202, onto which the buffer layer 206 of silicon dioxide is deposited, is preserved during the silicon dioxide deposition process of the present invention.

With the plasma enhanced chemical vapor deposition process of the present invention, the silane ($SiH_4$) gas from the silane ($SiH_4$) source 306 flows into the silicon dioxide deposition chamber 304 with a flow rate in a range of from about 50 sccm (standard cubic cm per minute) to about 110 sccm (standard cubic cm per minute). The nitrogen ($N_2$) gas from the nitrogen ($N_2$) source 308 flows into the silicon dioxide deposition chamber 304 with a flow rate in a range of from about 500 sccm (standard cubic cm per minute) to about 3000 sccm (standard cubic cm per minute). The nitrous oxide ($N_2O$) gas from the nitrous oxide ($N_2O$) source 310 flows into the silicon dioxide deposition chamber 304 with a flow rate in a range of from about 5000 sccm (standard cubic cm per minute) to about 9000 sccm (standard cubic cm per minute).

In addition, the temperature within the silicon dioxide deposition chamber 304 is set to be about 170° C. or less via the deposition chamber temperature controller 320. In addition, the heating block 316 which holds the semiconductor wafer 302 during the plasma enhanced chemical vapor deposition process of the present invention is also heated up to be about 170° C. or less.

With the plasma enhanced chemical vapor deposition process of the present invention, a high frequency RF signal is applied on the showerhead 312 from the high frequency RF signal generator 314. In the present invention, the high frequency RF signal applied on the showerhead 312 has a power in a range of from about 200 Watts to about 600 Watts. Additionally, a low frequency RF signal is applied on the heating block 316 that holds the semiconductor wafer 302 during the plasma enhanced chemical vapor deposition process of the present invention. In the present invention, the low frequency RF signal is generated from the low frequency RF signal generator 318 with a power in a range of from about 150 Watts to about 400 Watts.

The low frequency RF signal applied to the heating block 316 creates a voltage bias on the heating block 316. Such voltage bias on the heating block 316 attracts the plasma generated by the showerhead 312 toward the semiconductor wafer 302. Thus, plasma from the showerhead 312 is present near the semiconductor wafer 302 during the plasma enhanced chemical vapor deposition process of the present invention.

With the plasma enhanced chemical vapor deposition process of the present invention, the silicon dioxide deposition chamber 304 has a predetermined volume such that pressure within the silicon dioxide deposition chamber 304 is in a range of from about 0.5 torr to about 1.3 torr.

With the above-mentioned conditions within the silicon dioxide deposition chamber 304, the semiconductor wafer 302 is placed within the silicon dioxide deposition chamber 304 for a soak time period in a range of from about 30 seconds to about 40 seconds. During such time period, the semiconductor wafer 302 soaks up to a higher temperature to reach a deposition temperature of about 170° C. or less. During such soak time, the high frequency RF signal from the high frequency RF signal generator 314 is not applied on the showerhead 312, and the low frequency RF signal from the low frequency RF signal generator 318 is not applied on the heating block 316.

Before the semiconductor wafer 14 is placed into the silicon dioxide deposition chamber 304 for the soak time, the silicon dioxide deposition chamber 304 may be pre-seasoned for 300 seconds. In such a preseasoning process, the silicon dioxide deposition chamber 304 and the heating block 316 are preheated to a temperature of about 170° C. or less with the silane ($SiH_4$) gas, the nitrogen ($N_2$) gas, and the nitrous oxide ($N_2O$) gas flowing into the silicon dioxide deposition chamber 304 with the respective flow rates discussed above.

After thus preseasoning the silicon dioxide deposition chamber 304, the semiconductor wafer 302 is placed into the silicon dioxide deposition chamber 304. The semiconductor wafer 302 is placed on the heating block 316 for a soak time period in a range of from about 30 seconds to about 40 seconds. During such time period, the semiconductor wafer 302 soaks up to a higher temperature to reach a deposition temperature of about 170° C. or less. During such soak time, the high frequency RF signal from the high frequency RF signal generator 314 is not applied on the showerhead 312, and the low frequency RF signal from the low frequency RF signal generator 318 is not applied on the heating block 316.

After the temperature soak time when the semiconductor wafer 302 has reached the deposition temperature, silicon dioxide deposition takes place on the semiconductor wafer 302 when the high frequency RF signal from the high frequency RF signal generator 314 is applied on the showerhead 312 and when the low frequency RF signal from the low frequency RF signal generator 318 is applied on the heating block 316. The time period for the silicon dioxide deposition onto the semiconductor wafer 302 is from about 5 seconds to about 30 seconds.

In this manner, a silicon dioxide layer is deposited onto the semiconductor wafer within the silicon dioxide deposition chamber 304 using a plasma enhanced chemical vapor deposition process at low temperatures of about 170° C. or less. In prior art silicon dioxide deposition processes, a higher temperature of about 300° C. is typically used. By using such low temperatures for deposition of the silicon dioxide layer, the present invention is especially amenable for depositing the silicon dioxide layer on top of a reflective layer used for a reflective mask as shown in FIG. 2. Because low temperatures are used, the structural integrity of the reflective layer already deposited on the semiconductor wafer 302 is preserved with the silicon deposition process of the present invention.

The foregoing is by way of example only and is not intended to be limiting. For example, instead of the semiconductor wafer 302, a glass substrate may hold the EUV mask structure. In addition, the advantageous features of the present invention may be used for deposition of a silicon dioxide layer for any type of application which requires deposition of silicon dioxide at lower temperatures. In general, the present invention may be advantageously used for deposition of a silicon dioxide layer whereby a low temperature of the semiconductor wafer during the deposition process is desired.

Furthermore, as will be understood by those skilled in the art, the mask structures described herein may be made or used in the same way regardless of their position and orientation. Accordingly, it is to be understood that terms and phrases such as "above" and "on top of" as used herein refer to the relative location and orientation of various portions of the structures with respect to one another, and are not intended to suggest that any particular absolute orientation with respect to external objects is necessary or required. The invention is limited only as defined in the following claims and equivalents thereof.

We claim:

1. A method for depositing silicon dioxide on a substrate at very low temperature using plasma enhanced chemical vapor deposition, the method including the steps of:

setting a temperature, in a silicon dioxide deposition chamber, to be about 170° C. or less;

flowing silane gas into the silicon dioxide deposition chamber with a flow rate in a range of from about 50 sccm (standard cubic cm per minute) to about 110 sccm (standard cubic in per minute);

flowing nitrogen gas ($N_2$) into the silicon dioxide deposition chamber with a flow rate in a range of from about 500 sccm (standard cubic cm per minute) to about 3000 sccm (standard cubic cm per minute);

flowing nitrous oxide gas ($N_2O$) into the silicon dioxide deposition chamber with a flow rate in a range of from about 5000 sccm (standard cubic cm per minute) to about 9000 sccm (standard cubic cm per minute);

using a predetermined volume for the silicon dioxide deposition chamber such that pressure within the silicon dioxide deposition chamber is in a range of from about 0.5 torr to about 1.3 torr;

placing the substrate inside the silicon dioxide deposition chamber for a soak time period in a range of from about 30 seconds to about 40 seconds;

applying a high frequency RF signal on a showerhead within the silicon dioxide deposition chamber, wherein the high frequency RF signal has a power in a range of from about 200 Watts to about 600 Watts; and applying a low frequency RF signal on a heating block for holding the substrate within the silicon dioxide deposition chamber, wherein the low frequency RF signal has a power in a range of from about 150 Watts to about 400 Watts, wherein silicon dioxide is deposited onto the substrate when said high frequency RF signal is applied on said showerhead and when said low frequency RF signal is applied on said heating block holding the substrate, and wherein said deposition of said silicon dioxide is onto a layer of photolithography material on said substrate, and wherein said deposition of said silicon dioxide at temperature of about 170° C. or less preserves the integrity of said layer of photolithography material.

2. The method of claim 1, further including the step of:

preseasoning the silicon dioxide deposition chamber to a temperature of about 170° C. or less for about 300 seconds before placing the substrate inside the silicon dioxide deposition chamber.

3. The method of claim 1, wherein said substrate is a semiconductor wafer and wherein said layer of photolithography material is a reflective layer of a reflective EUV mask and wherein silicon dioxide is deposited on top of the reflective layer.

4. The method of claim 1, wherein said substrate is a glass substrate and wherein said layer of photolithography material is a reflective layer of a reflective EUV mask and wherein silicon dioxide is deposited on top of the reflective layer.

5. The method of claim 1, wherein said low frequency RF signal is applied on said heating block for a time period from about 5 seconds to about 30 seconds.

6. A method for depositing silicon dioxide on a semiconductor wafer, having a reflective layer of a reflective EUV mask, at very low temperature using plasma enhanced chemical vapor deposition, the method including the steps of:

setting a temperature, in a silicon dioxide deposition chamber, to be about 170° C. or less;

flowing silane gas into the silicon dioxide deposition chamber with a flow rate in a range of from about 50 sccm (standard cubic cm per minute) to about 110 sccm (standard cubic cm per minute);

flowing nitrogen gas ($N_2$) into the silicon dioxide deposition chamber with a flow rate in a range of from about 500 sccm (standard cubic cm per minute) to about 3000 sccm (standard cubic cm per minute);

flowing nitrous oxide gas ($N_2O$) into the silicon dioxide deposition chamber with a flow rate in a range of from about 5000 sccm (standard cubic cm per minute) to about 9000 sccm (standard cubic cm per minute);

using a predetermined volume for the silicon dioxide deposition chamber such that pressure within the silicon dioxide deposition chamber is in a range of from about 0.5 torr to about 1.3 torr;

preseasoning the silicon dioxide deposition chamber to a temperature of about 170° C. for about 300 seconds before placing the semiconductor wafer inside the silicon dioxide deposition chamber;

placing the semiconductor wafer inside the silicon dioxide deposition chamber for a soak time period in a range of from about 30 seconds to about 40 seconds;

applying a high frequency RF signal on a showerhead within the silicon dioxide deposition chamber, wherein the high frequency RF signal has a power in a range of from about 200 Watts to about 600 Watts; and applying a low frequency RF signal on a heating block for holding the semiconductor wafer within the silicon dioxide deposition chamber for a time period of from about 5 seconds to about 30 seconds, wherein the low frequency RF signal has a power in a range of from about 150 Watts to about 400 Watts, wherein silicon dioxide is deposited onto the semiconductor wafer when said high frequency RF signal is applied on said showerhead and when said low frequency RF signal is applied on said heating block holding the substrate.

* * * * *